US008029703B2

(12) United States Patent
Park et al.

(10) Patent No.: US 8,029,703 B2
(45) Date of Patent: Oct. 4, 2011

(54) COMPOUND SEMICONDUCTOR AND ITS MANUFACTURING METHOD, AND THERMOELECTRIC CONVERSION DEVICE USING THE SAME

(75) Inventors: Cheol-Hee Park, Daejeon (KR); Se-Hui Sohn, Daejeon (KR); Won-Jong Kwon, Daejeon (KR); Tae-Hoon Kim, Daejeon (KR); Seung-Tae Hong, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 12/902,927

(22) Filed: Oct. 12, 2010

(65) Prior Publication Data

US 2011/0079750 A1    Apr. 7, 2011

Related U.S. Application Data

(63) Continuation of application No. PCT/KR2009/004872, filed on Aug. 31, 2009.

(30) Foreign Application Priority Data

Aug. 29, 2008 (KR) .................. 10-2008-0085240
Oct. 6, 2008 (KR) .................. 10-2008-0097779
Nov. 11, 2008 (KR) .................. 10-2008-0111557

(51) Int. Cl.
*H01B 1/08* (2006.01)
*H01L 31/0224* (2006.01)
*H01L 35/14* (2006.01)

(52) U.S. Cl. .................... 252/521.1; 136/240
(58) Field of Classification Search ............... 252/518.1, 252/521.1, 62.3 T; 136/236.1, 240, 256
See application file for complete search history.

(56) References Cited

U.S. PATENT DOCUMENTS

| 4,366,336 | A | 12/1982 | Donaghey |
| 5,418,007 | A | 5/1995 | Debe |
| 5,431,021 | A | 7/1995 | Gwilliam et al. |
| 5,487,952 | A | 1/1996 | Yoo et al. |
| 5,726,381 | A | 3/1998 | Horio et al. |
| 6,091,014 | A | 7/2000 | Eklund et al. |

(Continued)

FOREIGN PATENT DOCUMENTS

JP    11-031849    2/1999

(Continued)

OTHER PUBLICATIONS

Hiramatsu et al "Crystal Structures, Optoelectronic Properties, and Electronic Structures or Layered Oxychalcogenides MCuOCh . . . ", Chem. Mater. 2008, 20, 326-334.*

(Continued)

*Primary Examiner* — Mark Kopec
(74) *Attorney, Agent, or Firm* — McKenna Long & Aldridge LLP

(57) ABSTRACT

Disclosed is a new compound semiconductor represented by the chemical formula: $Bi_{1-x-y}Ln_xM_yCuOTe$ where Ln belongs to the lanthanoid series and is any one or more elements selected from the group consisting of La, Ce, Pr, Nd, Pm, Sm, Eu, Gd, Tb, Dy, Ho, Er, Tm, Yb and Lu, M is any one or more elements selected from the group consisting of Ba, Sr, Ca, Mg, Cd, Hg, Sn, Pb, Mn, Ga, In, Tl, As and Sb, and $0<x<1$, $0 \leq y \leq 1$ and $0<x+y<1$. The compound semiconductor can replace a conventional compound semiconductor or be used as a thermoelectric conversion device together with a conventional compound semiconductor.

14 Claims, 2 Drawing Sheets

U.S. PATENT DOCUMENTS

| | | | |
|---|---|---|---|
| 6,251,701 | B1 | 6/2001 | McCandless |
| 6,444,894 | B1 | 9/2002 | Sterzel |
| 6,660,925 | B1 | 12/2003 | Sharp |
| 6,743,973 | B2 | 6/2004 | Hayashi et al. |
| 6,942,728 | B2 | 9/2005 | Caillat et al. |
| 7,091,136 | B2 | 8/2006 | Basol |
| 7,649,139 | B2 * | 1/2010 | Mihara et al. ............ 136/236.1 |
| 2003/0110892 | A1 | 6/2003 | Nicoloau |
| 2005/0139249 | A1 | 6/2005 | Ueki et al. |
| 2011/0017935 | A1 * | 1/2011 | Park et al. ............ 252/62.3 T |

FOREIGN PATENT DOCUMENTS

| | | |
|---|---|---|
| JP | 11-186616 | 7/1999 |
| JP | 2001-223392 | 8/2001 |
| JP | 2002-232026 | 8/2002 |
| JP | 2004-288841 | 10/2004 |
| JP | 2007-258200 | 10/2007 |
| JP | 2008-085309 | 4/2008 |
| WO | WO 2010/024500 | 3/2010 |

OTHER PUBLICATIONS

Evans et al "Synthesis and characterization of the new oxyselenide B12YO4Cu2Se2", Chem. Commun., 2002, 912-913.*

B.A. Popovkin et al., "New Layered Phases of the MOCuX (M=Ln, Bi; X=S, Se, Te) Family: A Geometric Approach to the Explanation of Phase Stability", Russian Journal of Inorganic Chemistry, vol. 43, No. 10, 1998, pp. 1471-1475.

Kouichi Takase et al., "Charge Density Distribution of Transparent p-type Semiconductor (LaO) CuS", Applied Physics Letters 90, (2007) pp. 161916 (1-3).

Stampler et al. "Temperature Driven Reactant Solubilization Synthesis of BiCuOSe", Inorg. Chem. 2008, 47, 10009-16.

Zhao et al "Bi1-xSrxCuSeO oxyselenides as promising thermoelectric materials", Applied Physics Letters 97, 092118 (2010).

Sheets et al. "Facile Synthesis of BiCuOS by Hydrothermal Synthesis", Inorganic Chem. 2007, 46, 10741-48.

Ohtani et al "Electrical properties of layered copper oxyselenides (BiO)Cu1-xSe and (Bi1-xSrx)OcuSe", Journal of Alloys and compounds 262-263 (1997) 175-79.

* cited by examiner

[Fig. 1]
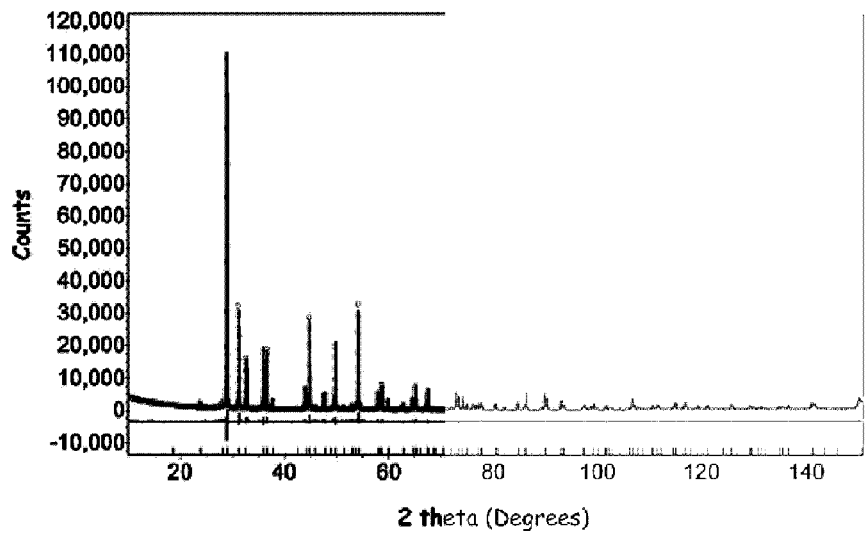
[Fig. 2]
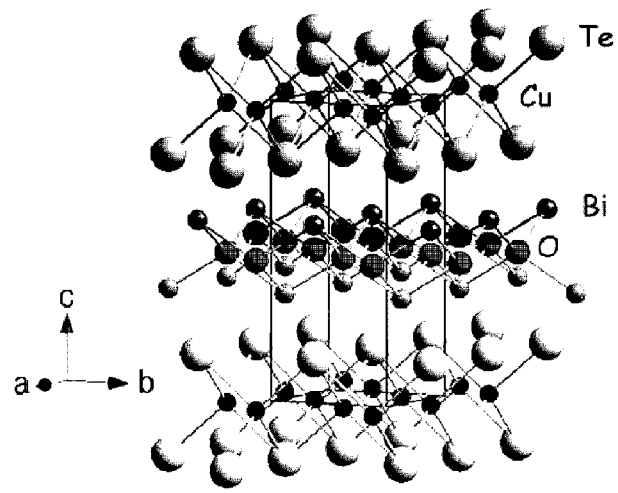
[Fig. 3]
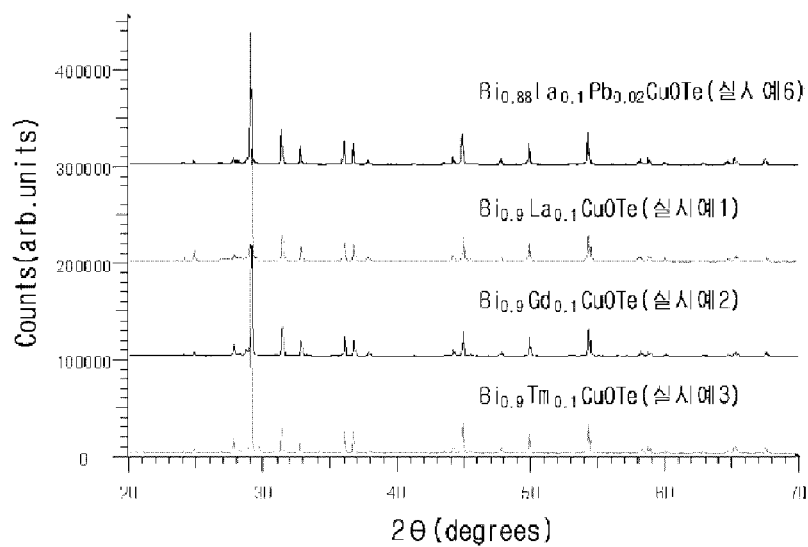

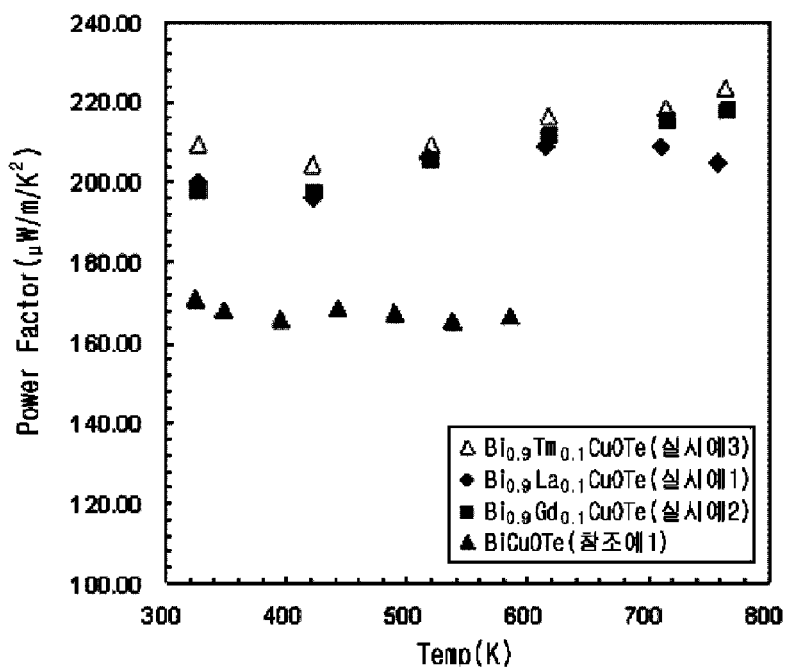
[Fig. 4]
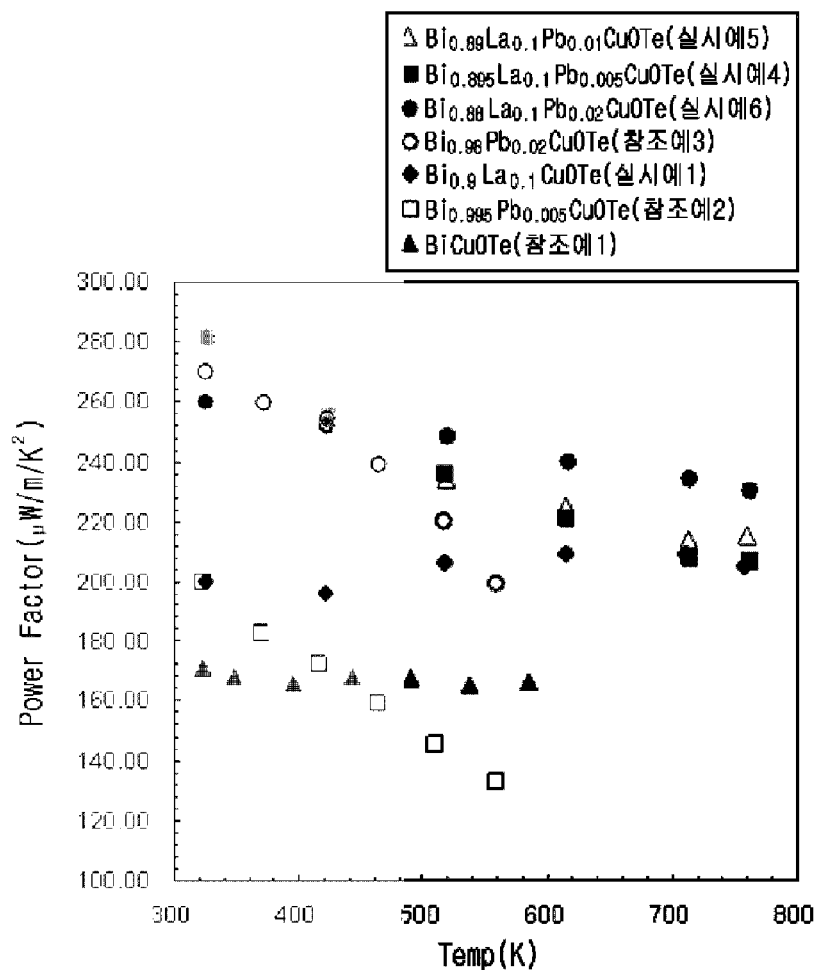
[Fig. 5]

COMPOUND SEMICONDUCTOR AND ITS MANUFACTURING METHOD, AND THERMOELECTRIC CONVERSION DEVICE USING THE SAME

This application is a Continuation of PCT/KR2009/004872, filed on Aug. 31, 2009, which claims the benefit of Korean Patent Application Nos. 10-2008-0085240, filed Aug. 29, 2008; 10-2008-0097779, filed Oct. 6, 2008; and 10-2008-0111557, filed Nov. 11, 2008, all of which are hereby incorporated by reference for all purposes as if fully set forth herein in their entireties.

BACKGROUND OF THE INVENTION

1. Field of the Invention

The present invention relates to a compound semiconductor and its manufacturing method, and a thermoelectric conversion device using the same.

2. Description of the Related Art

A compound semiconductor is a compound that is composed of elements from two or more different elements, not a single element such as silicon, germanium and so on, and acts as a semiconductor. Currently, various kinds of compound semiconductors have been developed and used in various industrial fields. For example, the compound semiconductor is representatively used to a solar cell or a light emitting device including a light emitting diode or a laser diode, using the photoelectric conversion effect, a thermoelectric conversion device using the Feltier Effect, and so on.

Among them, the thermoelectric conversion device is applied to thermoelectric power generation, thermoelectric cooling and so on. For example, thermoelectric power generation is a type of power generation that converts thermal energy into electric energy using a thermoelectromotive force caused by temperature difference in a thermoelectric conversion device.

The energy conversion efficiency of the thermoelectric conversion device is determined depending on Seebeck coefficient, electrical conductivity and thermal conductivity of a thermoelectric conversion material. More specifically, the energy conversion efficiency of the thermoelectric conversion material is in proportion to the square of Seebeck coefficient and the electrical conductivity, and in inverse proportion to the thermal conductivity. Therefore, it is required that the development of a thermoelectric conversion material having high Seebeck coefficient or high electrical conductivity or low thermal conductivity so as to improve the energy conversion efficiency of a thermoelectric conversion device.

SUMMARY OF THE INVENTION

It is an object of the present invention to provide a new compound semiconductor usable as a thermoelectric conversion material of a thermoelectric conversion device.

And, it is an object of the present invention to provide a method for manufacturing said new compound semiconductor.

Furthermore, it is an object of the present invention to provide a thermoelectric conversion device using said new compound semiconductor.

After repeated study, the inventors succeeded a synthesis of a compound semiconductor represented as the following chemical formula 1. And, the inventors discovered that this new compound can be used as a thermoelectric conversion material of a thermoelectric conversion device, and accomplished this invention.

$$Bi_{1-x-y}Ln_xM_yCuOTe \qquad \text{<Chemical formula 1>}$$

where Ln belongs to the lanthanoid series and is any one or more elements selected from the group consisting of La, Ce, Pr, Nd, Pm, Sm, Eu, Gd, Tb, Dy, Ho, Er, Tm, Yb and Lu, M is any one or more elements selected from the group consisting of Ba, Sr, Ca, Mg, Cd, Hg, Sn, Pb, Mn, Ga, In, Tl, As and Sb, and $0<x<1$, $0\leq y<1$ and $0<x+y<1$.

In the compound semiconductor according to the present invention, Ln may be La, Gd or Tm, and M may be Pb in the above chemical formula 1.

In the chemical formula 1, x and y are preferably $0<x\leq 0.5$ and $0\leq y23\ 0.5$, respectively, more preferably $0<x<0.2$ and $0\leq y<0.1$, respectively.

The present invention also provides a method for manufacturing said compound semiconductor represented by the above chemical formula 1 by mixing each powder of $Bi_2O_3$, Bi, Cu and Te with powder of any one or more elements selected from the group consisting of La, Ce, Pr, Nd, Pm, Sm, Eu, Gd, Tb, Dy, Ho, Er, Tm, Yb and Lu or oxides thereof, optionally mixing the mixed material with powder of any one or more elements selected from the group consisting of Ba, Sr, Ca, Mg, Cd, Hg, Sn, Pb, Mn, Ga, In, Tl, As and Sb or oxides thereof, and sintering the resulting material.

In the manufacturing method of the present invention, the sintering temperature is preferably 400 to 570° C.

EFFECTS OF THE PRESENT INVENTION

The new compound semiconductor according to the present invention may replace a conventional compound semiconductor or may be used as another material together with a conventional compound semiconductor. In particular, the compound semiconductor according to the present invention has good thermoelectric conversion performance, and thus it can be usefully applied to a thermoelectric conversion device. Furthermore, the compound semiconductor according to the present invention can be applied to a light absorbing layer of a solar cell, an IR window allowing a selective transmission of infrared rays, or an infrared sensor.

BRIEF DESCRIPTION OF THE DRAWINGS

The accompanying drawings illustrate the preferred embodiments of the present invention and are included to provide a further understanding of the spirit of the present invention together with the detailed description of the invention, and accordingly, the present invention should not be limitedly interpreted to the matters shown in the drawings FIG. 1 is a graph illustrating a Rietveld profile of BiCuOTe by comparison between an X-ray diffraction pattern and a theoretical pattern of a structural model.

FIG. 2 is a view illustrating a crystal structure of BiCuOTe.

FIG. 3 is a graph illustrating X-ray diffraction patterns of compounds according to examples 1 to 3 and 6 of the present invention.

FIG. 4 is a graph illustrating power factors of compounds according to examples 1 to 3 of the present invention and a compound according to a reference example.

FIG. 5 is a graph illustrating power factors of compounds according to examples 1 and 4 to 6 of the present invention and compounds according to reference examples 1 to 3.

DESCRIPTION OF THE PREFERRED EMBODIMENT

A compound semiconductor according to the present invention is represented by the following chemical formula 1.

$$Bi_{1-x-y}Ln_xM_yCuOTe \qquad \text{<Chemical formula 1>}$$

where Ln belongs to the lanthanoid series and is any one or more elements selected from the group consisting of La, Ce, Pr, Nd, Pm, Sm, Eu, Gd, Tb, Dy, Ho, Er, Tm, Yb and Lu, M is any one or more elements selected from the group consisting of Ba, Sr, Ca, Mg, Cd, Hg, Sn, Pb, Mn, Ga, In, Tl, As and Sb, and $0<x<1$, $0 \leq y<1$ and $0<x+y<1$. That is, in the compound semiconductor according to the present invention, Bi in BiCuOTe is partially substituted by a lanthanoid series element, and may be further substituted by an element having a smaller oxidation number than Bi, such as Cd, Pb, and so on.

As mentioned above, the higher the Seebeck coefficient and electrical conductivity and the lower the thermal conductivity, the higher the thermoelectric conversion performance. Though description will be given below, BiCuOTe has a superlattice structure in which a $Cu_2Te_2$ layer and a $Bi_2O_2$ layer are repeated along a c-crystal axis, and thus, it has a remarkably lower thermal conductivity than $Bi_2Te_3$, a typical commercial thermoelectric conversion material, and has Seebeck coefficient similar to or higher than $Bi_2Te_3$. Accordingly, BiCuOTe is very useful as a thermoelectric conversion material.

Meanwhile, the Seebeck coefficient is directly related to entropy increase caused by movement of carriers in a material. As the number of the energy levels that carriers can occupy in a material, or the number of states that carriers can exist in a material becomes larger, the entropy increases and the Seebeck coefficient may increase accordingly. In an atomic orbital, because an f subshell has seven orbitals, the f subshell has more numbers of states than an s subshell having one orbital, a p subshell having three orbitals and a d subshell having five orbitals. Thus, if Bi in BiCuOTe is partially substituted by a lanthanoid series element having an f subcell with a vacant orbital according to the present invention, the entropy increases and consequently the Seebeck coefficient increases, possibly resulting in improvement in thermoelectric conversion performance.

And, when compared with $Bi_2Te_3$, BiCuOTe has a remarkably lower thermal conductivity and similar or higher Seebeck coefficient, but has a relatively lower electrical conductivity. To improve the electrical conductivity, it requires increasing the carrier concentration. An increase in carrier concentration may be achieved by partial substitution of Bi in BiCuOTe by $Pb^{2+}$ or $Cd^{2+}$ having a relatively smaller oxidation number. However, as the carrier concentration increases, electrical conductivity increases, but the Seebeck coefficient may decrease, and in some cases, thermoelectric conversion performance may be deteriorated. As mentioned above, there is a limitation in improving the thermoelectric conversion performance by partially substituting Bi by an element having a relatively smaller oxidation number. In addition, when at least one of electrical conductivity and Seebeck coefficient is increased, it needs to prevent reduction of the other one. In the present invention, this can be achieved by partially substituting Bi by the above-mentioned lanthanoid series element. That is, a reduction in Seebeck coefficient resulted from substitution by an element having a smaller oxidation number than Bi is offset by entropy increase resulted from substitution by a lanthanoid series element having the same oxidation number as Bi.

Accordingly, the compound semiconductor according to the present invention has excellent thermoelectric conversion performance, and thus it can replace a conventional thermoelectric conversion material or be usefully applied to a thermoelectric conversion device together with a conventional compound semiconductor. Furthermore, the compound semiconductor according to the present invention can be applied to a light absorbing layer of a solar cell, an IR window allowing a selective transmission of infrared rays, or an infrared sensor.

Meanwhile, in the above chemical formula 1, x and y are preferably $0<x \leq 0.5$ and $0 \leq y \leq 0.5$, respectively, more preferably $0<x<0.2$ and $0 \leq y<0.1$, respectively. And, y in the above chemical formula 1 may be 0. That is, Bi may be partially substituted by only a lanthanoid series element.

The compound semiconductor of the above chemical formula 1 may be manufactured by mixing each powder of $Bi_2O_3$, Bi, Cu and Te with powder of any one or more elements selected from the group consisting of La, Ce, Pr, Nd, Pm, Sm, Eu, Gd, Tb, Dy, Ho, Er, Tm, Yb and Lu or oxides thereof, selectively mixing the mixed material with powder of any one or more elements selected from the group consisting of Ba, Sr, Ca, Mg, Cd, Hg, Sn, Pb, Mn, Ga, In, Tl, As and Sb or oxides thereof, and sintering the resulting material, however the present invention is not limited in this regard.

The compound semiconductor according to the present invention may be manufactured by sintering in vacuum or sintering while flowing gas such as Ar, He, $N_2$, etc. that partially contains hydrogen or does not contains hydrogen. Preferably, the sintering temperature is around 400 to 750° C., more preferably 400 to 570° C.

Meanwhile, although the above description is made on the basis that Te in the compound semiconductor according to the present invention is used at a stoichiometrically fixed amount, Te may be partially substituted by another element such as S, Se, As, Sb and so on. This case follows the concept of the present invention that the Seebeck coefficient is increased by a partial substitution of Bi by a lanthanoid series element. Therefore, it should be interpreted that the scope of the present invention covers the case in which an element other than Bi is partially substituted by another element.

Hereinafter, the present invention will be described in detail with reference to the following examples. However, various modifications and changes may be made to the examples of the present invention, and it should not be interpreted that the scope of the present invention is limited to the following examples. The examples of the present invention are provided to an ordinary person skilled in the art for more complete understanding of the present invention.

REFERENCE EXAMPLE 1

Synthesis of BiCuOTe

First, for synthesis of BiCuOTe, 1.1198 g of $Bi_2O_3$ (Aldrich, 99.9%, 100 mesh), 0.5022 g of Bi (Aldrich, 99.99%, <10 m), 0.4581 g of Cu (Aldrich, 99.7%, 3 m) and 0.9199 g of Te (Aldrich, 99.99%, ~100 mesh) were mixed well using an agate mortar. The mixed material was put into a silica tube, vacuum-sealed and heated at 510° C. for 15 hours, so that BiCuOTe powder was obtained.

For an X-ray diffraction analysis, a test section was pulverized well, placed in a sample holder of an X-ray diffraction analyzer (Bruker D8-Advance XRD), and measured by scanning, wherein a scan interval was 0.02 degrees, Cu $K\alpha_1$ ($\lambda=1.5405$ Å) X-ray radiation was used, the applied voltage was 50 KV and the applied current was 40 mA.

A crystal structure of the obtained material was analyzed using TOPAS program (R. W. Cheary, A. Coelho, J. Appl. Crystallogr. 25 (1992) 109-121; Bruker AXS, TOPAS 3, Karlsruhe, Germany (2000)), and the analysis results are shown in the following Table 1 and FIG. 2.

TABLE 1

<The crystallographic data obtained from Rietveld refinement of BiCuOTe>

| Atom | Site | x | y | z | Occup. | Beq |
|------|------|------|------|-----------|--------|---------|
| Bi | 2c | 0.25 | 0.25 | 0.37257(5) | 1 | 0.56(1) |
| Cu | 2a | 0.75 | 0.25 | 0 | 1 | 0.98(3) |
| O | 2b | 0.75 | 0.25 | 0.5 | 1 | 0.26(12) |
| Te | 2c | 0.25 | 0.25 | 0.81945(7) | 1 | 0.35(1) |

[Space group I4/nmm (No. 129), a = 4.04138(6) Å, c = 9.5257(2) Å]

FIG. 1 is a graph illustrating a Rietveld profile of BiCuOTe by comparison between an X-ray diffraction pattern and a theoretical pattern of a structural model. Referring to FIG. 1, it was found that the measured pattern was consistent with the calculated pattern according to the results of Table 1. Thus, the material obtained according to the reference example 1 was identified as BiCuOTe.

As shown in FIG. 2, this BiCuOTe compound semiconductor exhibits a natural superlattice structure that a $Cu_2Te_2$ layer and a $Bi_2O_2$ layer are repeated along a c-crystal axis.

EXAMPLES 1 TO 3

Synthesis of $Bi_{0.9}Ln_{0.1}CuOTe$ $Bi_{0.9}Ln_{0.1}CuOTe$ was synthesized in the same way as the reference example 1 except that oxide ($Ln_2O_3$) powder of a lanthanoid series element was used for partial substitution of Bi. The used lanthanoid series element is La, Gd and Tm in examples 1 to 3, respectively, and a mixing amount of each raw powder for synthesis is as follows (unit: g).

TABLE 2

| | Classification | | | | |
|---|---|---|---|---|---|
| | $Bi_2O_3$ | Bi | Cu | Te | $Ln_2O_3$ |
| Example 1 (Ln = La) | 0.9681 | 0.5108 | 0.4660 | 0.9357 | 0.1195 |
| Example 2 (Ln = Gd) | 0.9638 | 0.5085 | 0.4639 | 0.9315 | 0.1323 |
| Example 3 (Ln = Tm) | 0.9610 | 0.5071 | 0.4626 | 0.9289 | 0.1404 |

Test sections of the compounds according to the examples 1 to 3 were prepared in the same way as the reference example 1 and gone through an x-ray diffraction analysis, and the analysis results are shown in FIG. 3. As seen from FIG. 3, each of the materials obtained from the examples 1 to 3 was identified as $Bi_{0.9}Ln_{0.1}CuOTe$.

EXAMPLES 4 TO 6 AND REFERENCE EXAMPLES 2 AND 3

Synthesis of $Bi_{0.9-x}La_{0.1}Pb_xCuOTe$ $Bi_{0.9-x}La_{0.1}Pb_xCuOTe$ was synthesized in the same way as the example 1 except that oxide (PbO) powder of Pb as an element (M) having a relatively smaller oxidation number was used for partial substitution of Bi. However, in the reference examples 2 and 3, Bi was not substituted by a lanthanoid series element. That is, $Bi_{0.995}Pb_{0.005}CuOTe$ was synthesized by partially substituting Bi by only Pb, and in the reference example 3, $Bi_{0.98}Pb_{0.02}CuOTe$ was synthesized by also partially substituting Bi by only Pb. At this time, Pb was used at different amounts in the reference examples 2 and 3. A mixing amount of each raw powder for synthesis is as follows (unit: g).

TABLE 3

| | Classification | | | | | |
|---|---|---|---|---|---|---|
| | $Bi_2O_3$ | Bi | Cu | Te | $La_2O_3$ | PbO |
| Example 4 (x = 0.005) | 1.4395 | 0.7663 | 0.6990 | 1.4037 | 0.1792 | 0.0123 |
| Example 5 (x = 0.01) | 1.4269 | 0.7664 | 0.6991 | 1.4038 | 0.1792 | 0.0246 |
| Example 6 (x = 0.02) | 1.4016 | 0.7666 | 0.6993 | 1.4042 | 0.1793 | 0.0491 |
| Reference example 2 | 1.6672 | 0.7534 | 0.6873 | 1.3800 | 0 | 0.0121 |
| Reference example 3 | 2.5356 | 1.1724 | 1.0695 | 2.1475 | 0 | 0.0751 |

A test section of the compound according to the example 6 was prepared in the same way as the reference example 1 and gone through an X-ray diffraction analysis, and the analysis results are shown in FIG. 3. As seen from FIG. 3, the material obtained from the example 6 was identified as $Bi_{0.88}La_{0.1}Pb_{0.02}CuOTe$.

<Evaluation of Thermoelectric Conversion Performance>

Each of the test sections obtained according to the reference examples and the examples as mentioned above was molded into a cylinder having a diameter of 4 mm and a length of 15 mm. Pressure of 200 MPa was applied to the cylinder using a CIP (Cold Isostatic Press). Subsequently, the resulting product was put into a quartz tube and vacuum-sintered at 510° C. for 10 hours.

Each of the sintered test sections was measured using ZEM-2 (Ulvac-Rico, Inc) at a predetermined temperature interval for electrical conductivity and Seebeck coefficient. A power factor was calculated that serves as an indicator of thermoelectric conversion performance and is defined as multiplication of the square of Seebeck coefficient by electrical conductivity. The calculated power factor is shown in FIGS. 4 and 5. As mentioned above, partial substitution of Bi by another element results in improvement of the electrical conductivity and reduction of the Seebeck coefficient. Thus, a power factor reflecting the changes in both electrical conductivity and Seebeck coefficient was used as a performance indicator in this embodiment.

Referring to FIG. 4, it is found that $Bi_{0.9}Ln_{0.1}CuOTe$ according to the examples 1 to 3 has the remarkably improved power factor than BiCuOTe of the reference example 1.

Referring to FIG. 5, it is found that the examples 4 to 6 according to partial substitution by both La and Pb exhibit the remarkably improved power factor than the reference example 1 without substitution and the reference examples 2 and 3 according to partial substituted by only Pb. As shown in FIG. 5, the power factors of the reference examples 2 and 3 according to substitution by only Pb rapidly reduce with increasing temperature. In particular, the power factor of the reference example 2 becomes smaller at temperature of 450 K or higher, compared with BiCuOTe without substitution. Therefore, according to the present invention, partial substitution of Bi by both La and Pb absolutely improves the power factor and alleviates a reduction rate of power factor with increasing temperature.

What is claimed is:

1. A compound semiconductor represented by the following chemical formula 1:

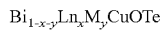   <Chemical formula 1>

$Bi_{1-x-y}Ln_xM_yCuOTe$ where Ln is any one or more elements selected from the group consisting of La, Ce, Pr, Nd, Pm, Sm, Eu, Gd, Tb, Dy, Ho, Er, Tm, Yb and Lu, M is any one or more elements selected from the group consisting of Ba, Sr, Ca, Mg, Cd, Hg, Sn, Pb, Mn, Ga, In, Tl, As and Sb, and $0<x<1$, $0 \leqq y<1$ and $0<x+y<1$.

2. The compound semiconductor according to claim 1, wherein, in the chemical formula 1, Ln is any one selected from the group consisting of La, Gd and Tm.

3. The compound semiconductor according to claim 2, wherein, in the chemical formula 1, M is Pb.

4. The compound semiconductor according to claim 3, wherein, in the chemical formula 1, x and y are $0<x \leqq 0.5$ and $0 \leqq y \leqq 0.5$, respectively.

5. The compound semiconductor according to claim 4, wherein, in the chemical formula 1, x and y are $0<x<0.2$ and $0 \leqq y<0.1$, respectively.

6. The compound semiconductor according to claim 1, wherein, in the chemical formula 1, y is 0.

7. A method for manufacturing a compound semiconductor represented by the chemical formula 1 of claim 1, comprising:

mixing each powder of $Bi_2O_3$, Bi, Cu and Te with powder of any one or more elements selected from the group consisting of La, Ce, Pr, Nd, Pm, Sm, Eu, Gd, Tb, Dy, Ho, Er, Tm, Yb and Lu or oxides thereof, optionally mixing the mixed material with powder of any one or more elements selected from the group consisting of Ba, Sr, Ca, Mg, Cd, Hg, Sn, Pb, Mn, Ga, In, Tl, As and Sb or oxides thereof, and sintering the resulting material to manufacture said compound semiconductor.

8. The method for manufacturing a compound semiconductor according to claim 7, wherein the sintering temperature is 400 to 570° C.

9. A thermoelectric conversion device including said compound semiconductor defined in claim 1 as a thermoelectric conversion material.

10. A thermoelectric conversion device including said compound semiconductor defined in claim 2 as a thermoelectric conversion material.

11. A thermoelectric conversion device including said compound semiconductor defined in claim 3 as a thermoelectric conversion material.

12. A thermoelectric conversion device including said compound semiconductor defined in claim 4 as a thermoelectric conversion material.

13. A thermoelectric conversion device including said compound semiconductor defined in claim 5 as a thermoelectric conversion material.

14. A thermoelectric conversion device including said compound semiconductor defined in claim 6 as a thermoelectric conversion material.

* * * * *